US012795839B2

(12) United States Patent
Tu et al.

(10) Patent No.: US 12,795,839 B2
(45) Date of Patent: Nov. 10, 2026

(54) INFORMATION PROCESSING DEVICE HAVING RECONFIGURABLE CHASSIS TO CONVERT BETWEEN DESKTOP AND MOUNTABLE CONFIGURATIONS

(71) Applicant: HEWLETT PACKARD ENTERPRISE DEVELOPMENT LP, Spring, TX (US)

(72) Inventors: Chen-Ruei Tu, New Taipei City (TW); Chia-Yuan Liu, Taipei City (TW); Kai Zhang, The Woodlands, TX (US); Chi-Ting Yang, New Taipei City (TW)

(73) Assignee: Hewlett Packard Enterprise Development LP, Spring, TX (US)

( * ) Notice: Subject to any disclaimer, the term of this patent is extended or adjusted under 35 U.S.C. 154(b) by 84 days.

(21) Appl. No.: 18/906,787

(22) Filed: Oct. 4, 2024

(65) Prior Publication Data

US 2026/0101451 A1 Apr. 9, 2026

(51) Int. Cl.
*H05K 5/02* (2006.01)
*G06F 1/16* (2006.01)

(52) U.S. Cl.
CPC ......... *H05K 5/0204* (2013.01); *G06F 1/1607* (2013.01)

(58) Field of Classification Search
CPC ............................ G06F 1/1607; H05K 5/0204
See application file for complete search history.

(56) References Cited

U.S. PATENT DOCUMENTS

| | | | | |
|---|---|---|---|---|
| 7,134,635 | B2 * | 11/2006 | Burriel | H05K 5/0204 248/500 |
| 10,492,316 | B2 * | 11/2019 | Sung | G06F 1/1601 |
| 2004/0211870 | A1 | 10/2004 | Bremmon et al. | |
| 2008/0186669 | A1 * | 8/2008 | Chang | G06F 1/1607 361/825 |
| 2014/0204521 | A1 | 7/2014 | Crisp et al. | |
| 2015/0264823 | A1 | 9/2015 | Shirley et al. | |
| 2017/0077692 | A1 | 3/2017 | Beckhart | |
| 2024/0414857 | A1 * | 12/2024 | Huang | H05K 5/0204 |
| 2026/0037023 | A1 * | 2/2026 | Files | G06F 1/1605 |

* cited by examiner

*Primary Examiner* — James Wu
(74) *Attorney, Agent, or Firm* — Jones Burke PLLC

(57) ABSTRACT

An information processing system comprises a chassis and a system board supported by the chassis. The chassis is reconfigurable between a desktop configuration and a mountable configuration. The chassis comprises two side walls and two side covers attached to the side walls. The side covers each comprise a first panel and a second panel connected together and perpendicular to one another. In the desktop configuration, the side covers are attached to the side walls by the second panels of the side covers. In the mountable configuration the side covers are attached to the side walls by the first panels of the side covers.

20 Claims, 16 Drawing Sheets

240'

INFORMATION PROCESSING DEVICE HAVING RECONFIGURABLE CHASSIS TO CONVERT BETWEEN DESKTOP AND MOUNTABLE CONFIGURATIONS

INTRODUCTION

Information processing systems, such as servers and networking devices, come in a variety of types designed for various applications. One type of information processing system is an edge system. Unlike rack-mount systems which are often mounted in industry standard server racks deployed in purpose-built server rooms or datacenters, edge systems are generally deployed "in the field" in environments which are not necessarily purpose-built for information processing devices, such as in warehouses, factory floors, shops, etc. These locations may not have a server rack, and thus edge systems are generally designed to be deployed on various other structures more commonly found in the edge environments. For example, some edge systems are designed to be supported by a horizontal surface like a table or desk, which may be referred to herein as a desktop configuration. Other edge systems may be designed for mounting to some upright structure, such as a wall, which may be referred to herein as a mountable configuration.

BRIEF DESCRIPTION OF THE DRAWINGS

The present disclosure can be understood from the following detailed description, either alone or together with the accompanying drawings. The drawings are included to provide a further understanding of the present disclosure and are incorporated in and constitute a part of this specification. The drawings illustrate one or more examples of the present teachings and together with the description explain certain principles and operations. In the drawings.

DETAILED DESCRIPTION

Figure 1:
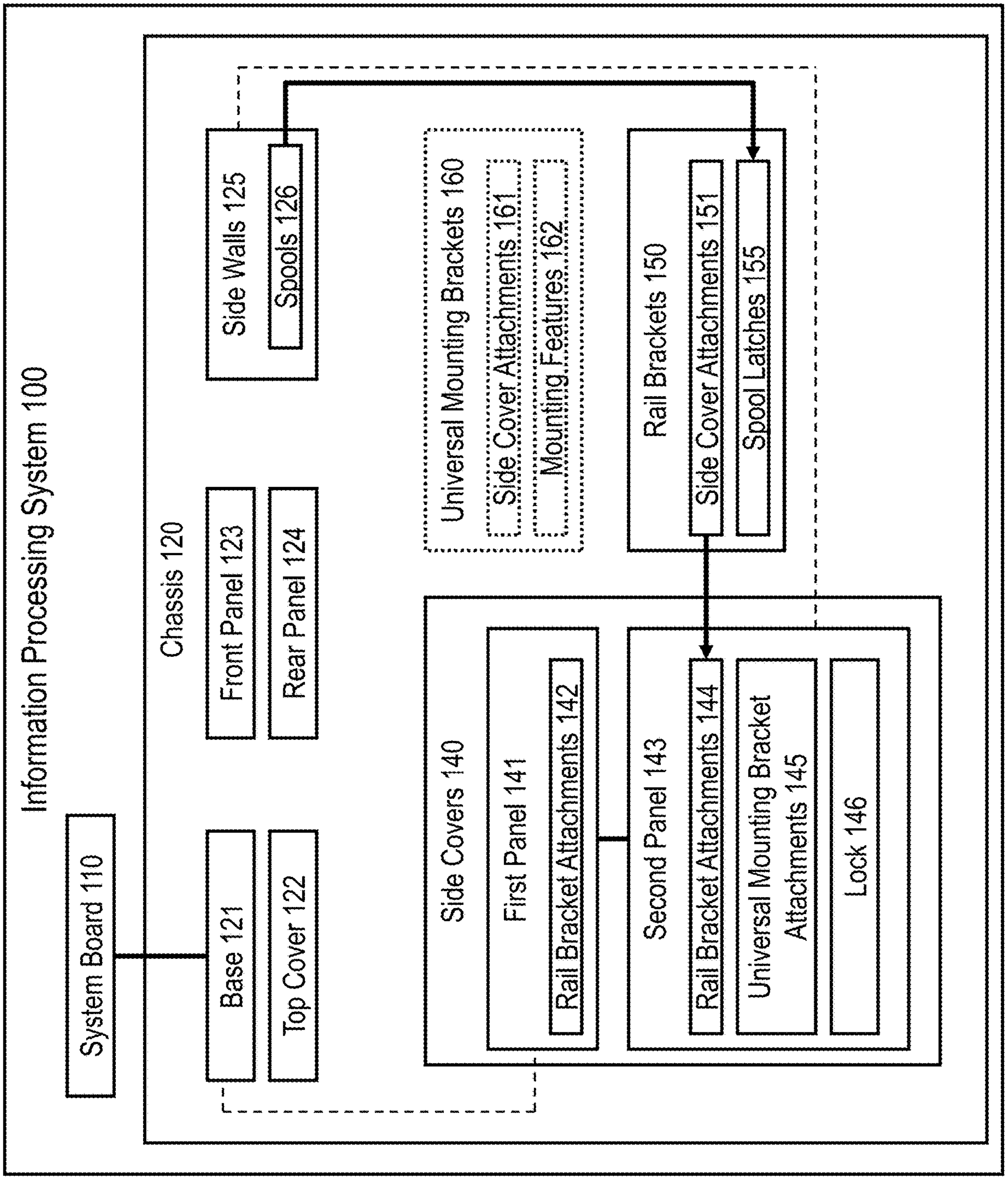
FIG. 1 is a block diagram illustrating an example information processing system in a desktop configuration.

In some cases, edge devices which are designed with a desktop configuration may have a different chassis structure than edge devices which are designed with a mountable configuration. For example, the chassis of desktop edge devices may have stabilizing feet to rest upon the horizontal supporting structure, whereas the chassis of a mountable edge device may have mounting structures to mount the device to an upright support. Manufacturers of such edge devices thus often end up producing multiple different chassis versions to accommodate these configurations. However, designing, producing, and handling different chassis for these devices can be relatively costly.

In addition, someone who purchases a desktop edge device may later decide that they want to mount it to an upright support, or vice versa. However, in some cases, the device they originally purchased may not be usable in the new configuration, and therefore the person may have to purchase a new device or forgo their desired change, which can be frustrating to the users.

Furthermore, for edge systems which are configured to be mountable to an upright structure, often the purchaser is required to purchase a separate mounting kit as an add-on to enable the mounting to certain structures. Different mounting kits may be offered for different types of mounting. For example, one mounting kit may be offered for wall mounting, another mounting kit may be offered for mounting to a video electronics standards association (VESA) support, and yet another mounting kit may be offered for mounting to a DIN rail. Thus, the purchasers may be required to figure out which mounting solution they need and correctly select it during the purchase process, which complicates the process and can be frustrating for users. Furthermore, if someone purchases one mounting kit designed for mounting to one type of structure, the purchaser cannot later move the system to a different type of support structure without first going back and purchasing a new mounting kit compatible with the new support structure. This lack of flexibility, as well as the costs incurred to the user, can be frustrating to the users. In addition, the manufacturer needs to design, produce, and handle multiple different option kits, which drives up development, manufacturing, and logistical costs.

To address these and other issues, disclosed herein are information processing systems which have a reconfigurable chassis which can be converted from a desktop configuration to a mountable configuration. Thus, a manufacturer does not need to produce multiple separate chassis for desktop and mounted applications, but instead can produce one chassis compatible with all these. This can reduce development, manufacturing, and logistical costs for the systems. In addition, a user does not need to select between desktop and mountable configurations at the time of purchase, which simplifies the purchase process. Also, the user is not locked-in to one configuration selected at purchase, but instead the user can reconfigure their system later if desired.

In addition, systems disclosed herein may include a universal mounting system which is compatible with mounting to multiple different upright support structures, such as, in some examples, a wall, a VESA mount, and a DIN mount. Because the same mounting system is compatible with multiple support structures, the manufacturer can produce just one mounting system, rather than multiple different mounting kits, which reduces development, manufacturing, and logistical costs. In addition, the purchaser does not need to select between multiple different mounting kits at the time of purchase, which simplifies the purchase process. Indeed, in some cases, because the systems can be reconfigured between desktop and mountable configurations, and because the same mounting system can be used with each such system, a manufacturer may be able to provide the universal mounting solution as an included part of every system without the purchaser needing to separately select or add it as an option kit. This can even further simplify the purchase process and provides flexibility to users by allowing them to change between multiple support arrangements without having to purchase new kits, thus greatly improving customer satisfaction.

These and other examples will be described in greater detail below in relation to FIGS. 1-18.

Figure 2:
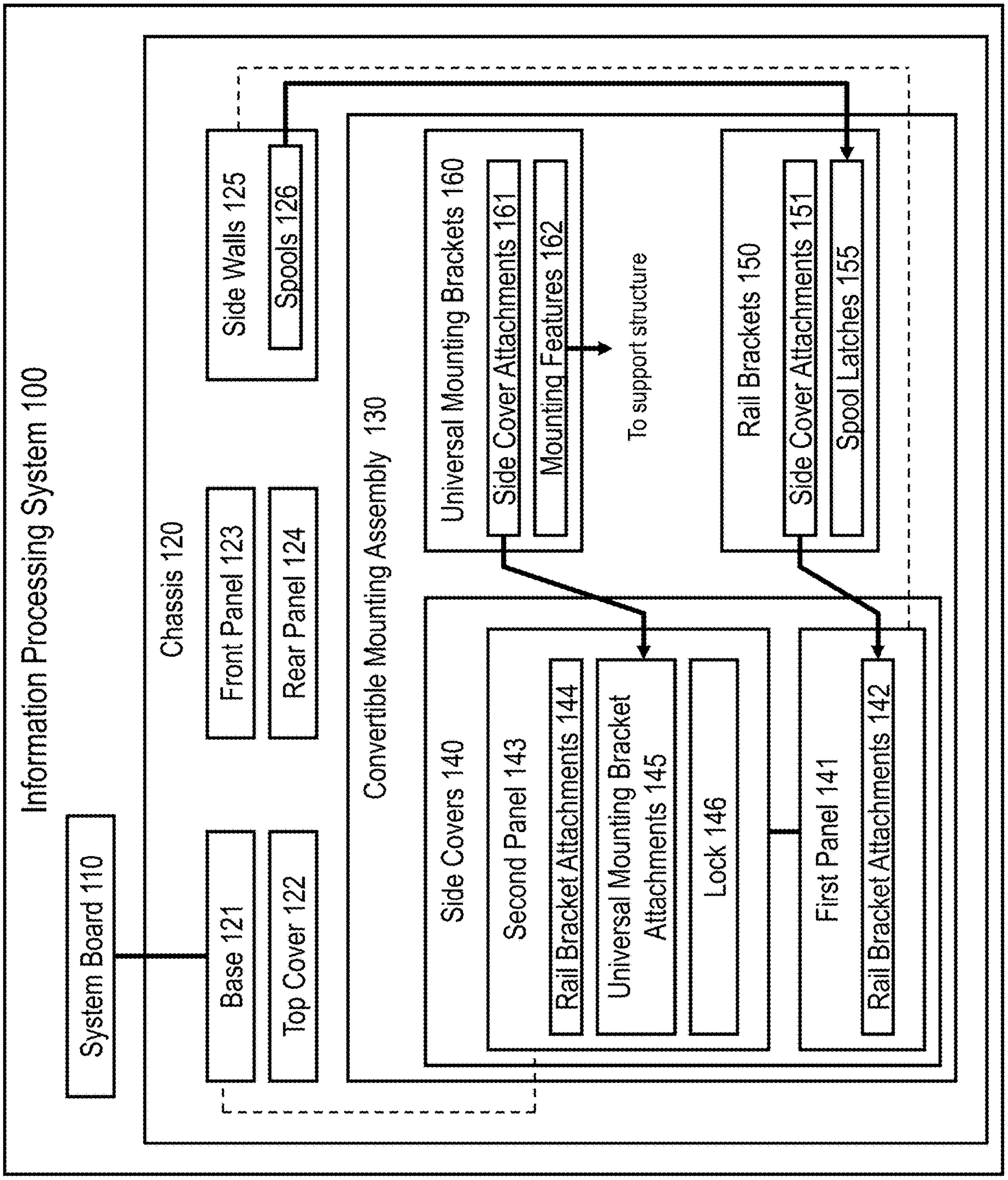
FIG. 2 is a block diagram illustrating the system of FIG. 1 in a mountable configuration.

FIGS. 1 and 2 illustrate an example information processing system 100 which is reconfigurable between desktop and mountable configurations. FIG. 1 illustrates the system 100 in the desktop configuration, while FIG. 2 illustrates the system 100 in the mountable configuration. FIGS. 1 and 2 are schematic in nature and are not intended to illustrate shapes, sizes, spatial relationships, or other structural details accurately or to scale, unless otherwise noted herein. Components which are not illustrated in FIGS. 1 and 2 may also be included in some examples disclosed herein, or one or more components illustrated in FIGS. 1 and 2 may be omitted from some examples disclosed herein. In FIGS. 1 and 2, solid lines extending between blocks indicate attachment/coupling between the components represented by the blocks, and dashed lines extending between blocks indicate engagement between the components represented by the blocks.

The information processing system 100 may be server, networking device, or other information processing system. In some examples, the system 100 is an edge system, such as an edge server. The system 100 comprises a system board 110, a chassis 120, and a convertible mounting assembly 130 which is, at least in part, integrated into the chassis 120.

The system board 110 may be a motherboard, host-processor module (HPM), or other system board. The system board 110 comprises a printed circuit board (PCB) and various components mounted to the PCB, such as a processor, memory modules, etc.

The chassis 120 comprises an enclosure which houses and supports the system board 110 and other components of the system 100, as well as various internal support structures to support those components. For example, the chassis 120 is formed from a base 121, a front panel 123, a rear panel 124, a top cover 122, and two side walls 125, which together form a housing/enclosure of the system 100, as is familiar to those of ordinary skill in the art. The front panel 123, rear panel 124, and side walls 125 are all perpendicular to the base 121. The top cover 122 is parallel to the base 121 and may be fully or partially removable or openable to allow access to the interior of the chassis 120. The front panel 123 and rear panel 124 are disposed opposite one another, with the two side walls 125 being perpendicular to and extending between the front panel 123 and the rear panel 124. A front-to-rear direction corresponds to the direction that the side walls 125 extend from the front panel 123 to the rear panel 124. The front panel 123 and the rear panel 124 may include airflow openings to allow airflow through the chassis, as well as electrical connectors or other ports. In addition, various bays may be provided at the front panel 123 and/or the rear panel 124 to allow for the removable installation of removable modules in the system, such as storage drives and PSUs. In some cases, portions of these removable modules may become part of the front panel 123 or the rear panel 124 when installed in the system (i.e., neither the front panel 123 nor the rear panel 124 is necessarily formed from a single monolithic structure).

In addition, the chassis 120 includes two side covers 140 (one is illustrated in FIG. 1 to simplify the drawings) and two rail brackets 150. Each side cover 140 is mounted to one of the side walls 125 via engagement with spools 126 attached to the side walls 125. Each rail bracket 150 is attached to one of the side covers 140.

The side covers 140 may serve a variety of purposes. One purpose for the side covers 140 is to cover up the side walls 125 and give the outer surfaces of the chassis 120 a more uniform, finished, and aesthetically pleasing appearance. The side walls 125 may have a relatively unfinished appearance or an appearance which may not match the design aesthetic of the rest of the external portions of the chassis 120. For example, other external surfaces may have surface features such as color or textures, or other industrial design features such as angled surfaces, bevels/chamfers, etc., while the side walls may be straight sheet metal lacking such features. The side covers 140 may have the design features which match the overall design aesthetic of the system, and thus covering the side walls 125 with the side covers 140 can improve the overall appearance of the system. Furthermore, the front portion of the system often includes so-called "ears" which protrude laterally outward, with the ears being usable to mount the device to a rack. As a result of the protruding ears, the side of the system may have a jagged or stepped appearance. The side walls 125 can fill the empty space on the sides of the system and sit flush with the ears such that the side of the system has a more uniform and smooth appearance.

Another purpose of the side covers 140 is to provide support features for desktop deployment of the system. The side covers 140 may carry stabilizing supports on a bottom side thereof, such as rubber pads or "feet," which support the system 100 when it is disposed on a horizontal surface. This may reduce vibrations and improve heat dissipation by providing an air gap.

One reason that the side walls 125 might not already include the aforementioned aesthetic features or why the chassis 120 does not already include stabilizing supports may be that aspects of the chassis 120 may be designed based on a chassis of another device, like a rack-mount server. In other words, the chassis 120 may have some rack-mount server features built into it—in some cases, the main enclosure portion of the chassis 120 may even be identical to a chassis designed for a separate rack-mount server system. Leveraging designs across multiple different systems in this manner can reduce costs of the manufacturer. However, it can also result in some of the issues noted above. In particular, in rack-mount devices, the appearance of the side walls is not usually something that is considered, as the side walls are not usually seen when the device is in use in a rack. Furthermore, desktop mounting features are usually not provided in rack-mount server chassis as these devices are intended for rack mounting, not desktop deployment. However, with an edge device, the device may be visible from many sides when in use, for example when deployed on a desk, and therefore a chassis designed for a rack-mount system, without modification, might be suboptimal for use in an edge device. To address this, the side covers 140 may be added to improve the appearance and add desktop mounting features.

The side covers 140 include two panels 141 and 143 which are coupled to one another. The side panels are oriented perpendicular to one another, so that the side cover 140 has an L-shaped cross-section. In the desktop configuration, the second panel 143 is configured to positioned adjacent to and abutting one of the side walls 125, whereas the first panel 141 is configured to be positioned under and abutting the base 121, as suggested by the dashed lines in FIG. 1. The first panel 141 may carry, or may serve as, the stabilizing supports or "feet" of the system 100 which contact a horizontal support when they system 100 is deployed in the desktop configuration. The second panel 143 may comprises aesthetic design features, as previously described, and is configured to cover the side wall 125 in the desktop configuration.

Because the second panel 143 is to cover the side wall 125, the second panel 143 may have height and length dimensions which are similar to those of the side wall 125 (excluding any protruding ears or other lateral protrusions at the front portion of the system 100). As noted, the chassis 120 may have ears or other lateral protrusions near a front portion thereof, and the second panel 143 may extend from the rear end of those ears to approximately the rear panel 124. Furthermore, in some examples, the second panel 143 may have thickness which is the same as the distance that the ears or protrusions protrude from the side wall 125 such that, when the second panel 143 is mounted to the side wall 125, and outer surface of the second panel 143 is substantially flush with outer edge of the protrusions. In this manner, the second panel 143 may give the side of the system 100 a more finished, uniform, and aesthetically pleasing appearance in the desktop configuration.

In some examples, the first panel 141 may have the same length as the second panel 143. In some examples, the first panel 141 may have a similar height as the second panel 143. In some examples, the first panel 141 may be substantially thinner than the second panel 143.

As previously noted, the side covers 140 are attached to the side walls 125 via rail brackets 150. Specifically, each rail bracket 150 comprises a number of spool latches 155 which are configured to engage with spools 126 attached to the side walls 125, thereby securing the rail bracket 150 to the side wall. The rail bracket 150 is in turn attached to one of the first panel 141 and the second panel 143, thereby securing the side cover 140 to the side wall 125. Each side cover 140 has one corresponding rail bracket 150. The rail bracket 150 can be interchangeably attached to either the first panel 141 or the second panel 143, depending on the current system configuration, via side cover attachments 151. The side cover attachments 151 are configured to engage with complementary rail bracket attachments 142 or 144 of the first or second panels 141 or 143. The side cover attachments 151 and the rail bracket attachments 142 and 144 may comprise complimentary attachment features. For example, side cover attachments 151 may comprise a set of fastener holes (threaded or unthreaded) extending in or through the rail bracket 150 and arranged in a given pattern, and the rail bracket attachments 142 and 144 may each comprise a set of fastener holes or nuts extending in or through the first panel 141 and second panel 143 and arranged in a similar pattern as the side cover attachments 151 so that the respective sets of holes align with one another when the rail bracket 150 is positioned on the first panel 141 or second panel 143. Thus, fasteners (e.g., screws) can be inserted through aligned pairs of the holes, thereby attaching the components together.

Thus, the rail bracket 150 may be interchangeably attached to either the first panel 141 or the second panel 143. Changing which panel 141 or 143 the rail bracket 150 is attached to is one part of how the chassis can be reconfigured from the desktop configuration to the mountable configuration, as will be described in greater detail below.

In the desktop configuration shown in FIG. 1, the rail bracket 150 is attached to the second panel 143, and the second panel 143 is attached to the side wall 125 via the rail bracket is 150. In contrast, in the mountable configuration shown in FIG. 2, the rail bracket 150 is attached to the first panel 141, and the first panel 141 is attached to the side wall 125 via the rail bracket is 150.

The desktop configuration and the mountable configuration also differ from one another in that in the mountable configuration a convertible mounting assembly 130 is used. The mounting assembly 130 is formed in part by portions of the chassis 120, most notably the side covers 140. In addition, the mounting assembly 130 also comprises universal mounting brackets 160. As shown in FIG. 2, in the mountable configuration, the universal mounting brackets 160 are attached to the side covers 140, whereas in the desktop configuration the universal mounting brackets 160 are not used. These universal mounting brackets 160 may be included along with the system 100 at purchase, allowing the user the choice of whether to use the desktop configuration or the mountable configuration.

More specifically, in the mountable configuration, the two side covers 140 are detached from the rest of the chassis 120 and are arranged parallel to one another. Then, one or more universal mounting brackets 160 are disposed crosswise extending between the two side covers 140. One end of the universal mounting bracket 160 is then attached to the second panel 143 of one side cover 140 while the other end of the universal mounting bracket 160 is attached to the second panel 143 of the other side cover 140. This forms the mounting assembly 130 comprising the two side covers 140 and the one or more universal mounting brackets 160 all coupled together. This mounting assembly 130 is then attached to a support, such as a wall, VESA mount, or DIN mount. With the mounting assembly 130 attached to the support, the remainder of the chassis 120 can then be attached to the mounting assembly 130 by attaching the side walls 125 to the first panels 141 of the side covers 140 (via spools 126 engaging the spool latches of the rail brackets 150, which are attached to the first panels 141). In this manner the system 100 is mounted to the support via the mounting assembly 130.

The universal mounting brackets 160 comprise side cover attachments 161 and mounting features 162 to facilitate the above-described connections. The side cover attachments 161 are complementary to, and engage with, universal mounting bracket attachments 145 in the second panel, thereby attaching the universal mounting bracket 160 thereto. In some examples, the universal mounting bracket attachments 145 and the side cover attachments 161 may include complimentary fastener holes through which fasteners can be extended to attach the components together.

The second panel 143 and the brackets 160 are both configured so as to position the mounting features 162 of the universal mounting bracket 160 in predetermined patterns which correspond to, and allow mounting to, different support structures. When multiple brackets 160 are used, the locations of the mounting features 162 relative to one another—i.e., the two-dimensional positional arrangement or pattern of the mounting features 162—depend not only on their relative placement along each bracket 160, but also on the position of the brackets 160 relative to one another. The relative positions of the mounting features 162 along the length of the bracket 160 may control the positioning of the mounting features 162 along one dimension, while the relative positioning of the brackets 160 along the second panel 143 may control the positioning of the mounting features 162 in along a second dimension. The positioning of the brackets 160 along the second panel 143 is controlled by the positioning of the universal mounting bracket attachments 145. Thus, the universal mounting bracket attachments 145 of the second panel 143 may be positioned at predetermined positions along the second panel 143, and the mounting features 162 may be positioned along each the brackets 160, in such a manner as will result in the entire group of mounting features 162 thereof having the desired two-dimensional positional arrangement.

In particular, the mounting features 162 may include a set of VESA compatible threaded standoffs which are arranged to match a VESA mounting pattern, thus allowing the mounting brackets 160 to be connected to a VESA mount via fasteners extending through these standoffs. VESA defines a number of fastener placement patterns, such as a square pattern with four fasteners arranged at the corners of a 100 mm×100 mm square or a rectangular pattern with four fasteners arranged at the corners of a 100 mm×200 mm rectangle. Thus, in some examples, each mounting bracket 160 may include two such VESA standoffs spaced apart along the length of the bracket 160, and two such mounting brackets 160 may be arranged parallel to one another at predetermined positions such that there are four standoffs arranged at the corners of a square or rectangle. This square or rectangle can be made to have the dimensions of one of the VESA specified patterns by controlling the separation distance between the two standoffs on a given bracket 160 and by controlling the separation distance between the two brackets 160, which is in turn controlled based on the locations of the universal mounting bracket attachments 145.

For example, in some implementations, the VESA standoffs of each bracket 160 may be separated from one another along the length of the bracket 160 by 100 mm. Furthermore, the universal mounting bracket attachments 145 of each second panel 143 may include a first pair of attachments 145 spaced apart from one another by 100 mm and/or a second pair of attachments 145 spaced apart from one another by 200 mm. With this arrangement, if two of the brackets 160 are attached to the first pair of attachments 145, this results in the four VESA standoffs being arranged at the four corners of a 100 mm×100 m square, which matches the 100 mm×100 mm square VESA fastener pattern. Or, if the two of the brackets 160 are attached to the second pair of attachments 145, this results in the four VESA standoffs being arranged at the four corners of a 100 mm×200 m rectangle, which matches the 100 mm×200 mm rectangle VESA fastener pattern. Accordingly, by controlling the locations of the mounting features 162 of each bracket 160, and the locations of the universal mounting bracket attachments 145 of each second panel 143, any desired two-dimensional pattern can be obtained for the mounting features 162.

The mounting features 162 may also include a subset of fastener holes which are different than the VESA standoffs and which are configured to receive a screw for insertion into a wall or other vertical support. In some examples, these screw holes may be unthreaded, unlike the VESA standoffs. This screw holes may also be, in some examples, more widely spaced along the length of the brackets 160 than the VESA standoffs.

In some examples, the mounting features 162 may include additional mounting features, such as additional screw holes, having some other pattern compatible with some other support structure type. In some examples, some of the mounting features 162 may be compatible with multiple support structure types. For example, in some cases, the screw holes for the wall mounting may also be used to attach to a DIN clip, which can in turn be attached to a DIN rail.

In some examples, the second panel 143 may include a lock 146. The lock 146 may be actuatable by a user to prevent disengagement of the rail brackets 150 from the side walls 125, thereby locking the side cover 140 to the side wall 125. In some examples, the spools 126 engage with and disengage from the spool latches 155 by the side cover 140 sliding parallel to a given axis relative to the side walls 125. In some cases, the lock 146, when engaged, prevents such sliding of the side cover 140 relative to the side walls 125, and thereby prevents disengagement of the spools 126 from the spool latches 155. In this manner, the lock 146 may prevent separation of the side covers 140 from the rest of the chassis 120. This may be useful in the desktop configuration as it may prevent the side covers 140 from falling off if the system 100 is moved. This may also be useful in the mountable configuration, as it may prevent the rest of the chassis 120 from falling out of the mounting frame (comprising the side covers and mounting brackets 160) which is attached to the wall or other support structure.

Turning now to FIGS. 3-17, an example implementation of the system 100 will be described. Specifically, FIGS. 3-17 illustrated an information processing system 200, which is one example implementation of the system 100. In FIGS. 3-17, components of the system 200 which correspond to (i.e., are example implementations of) components of the system 100 will be given similar reference numbers having the same last two digits, such as 120 and 220. Descriptions of components of the system 100 above also may apply to the corresponding components of the system 200, and thus duplicative description of aspects already described above may be omitted below, with the description focusing on aspects of the system 200 which have not heretofore been described.

Figure 3:
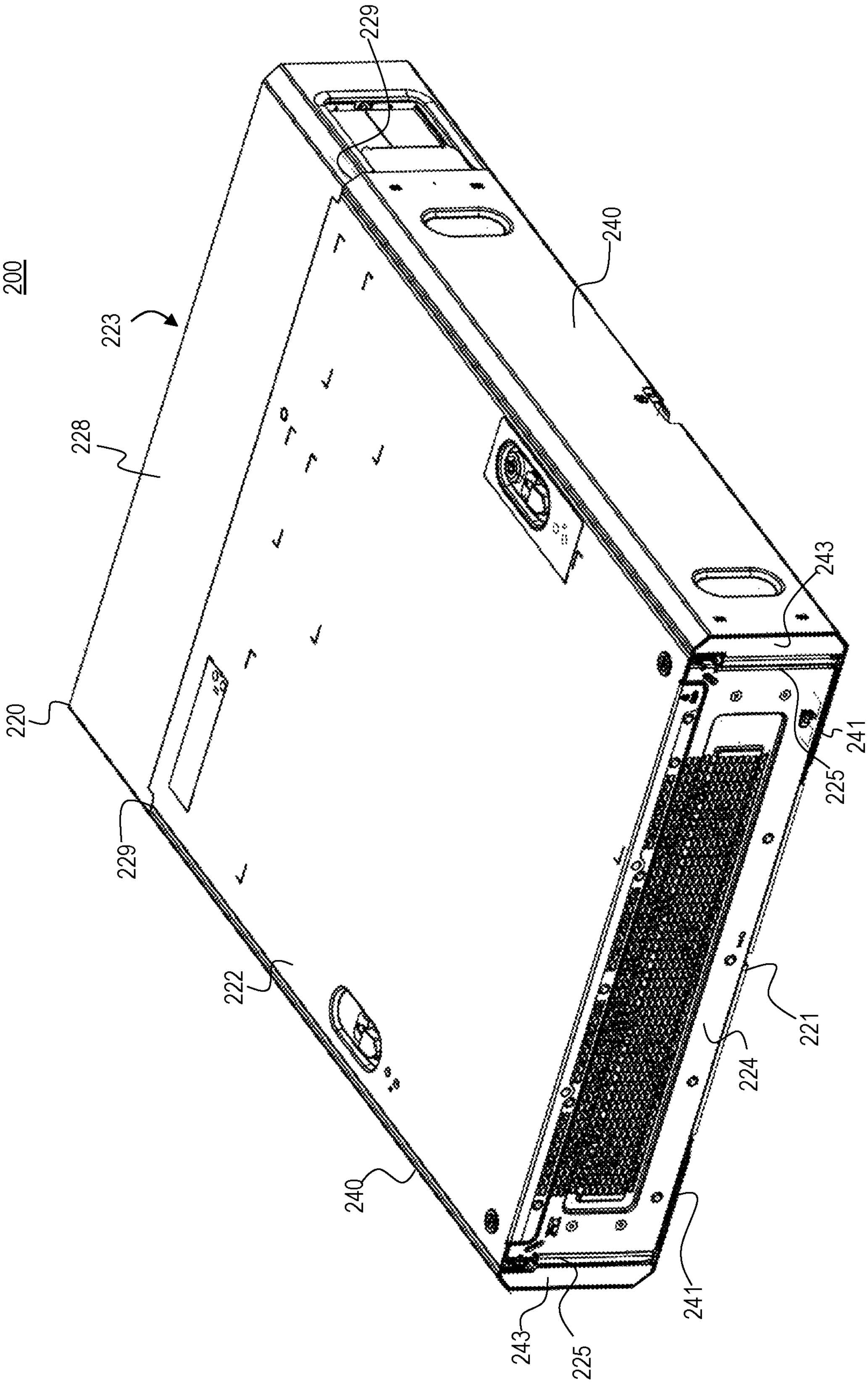
FIG. 3 is a perspective view of another example information processing system in the desktop configuration.
Figure 12:
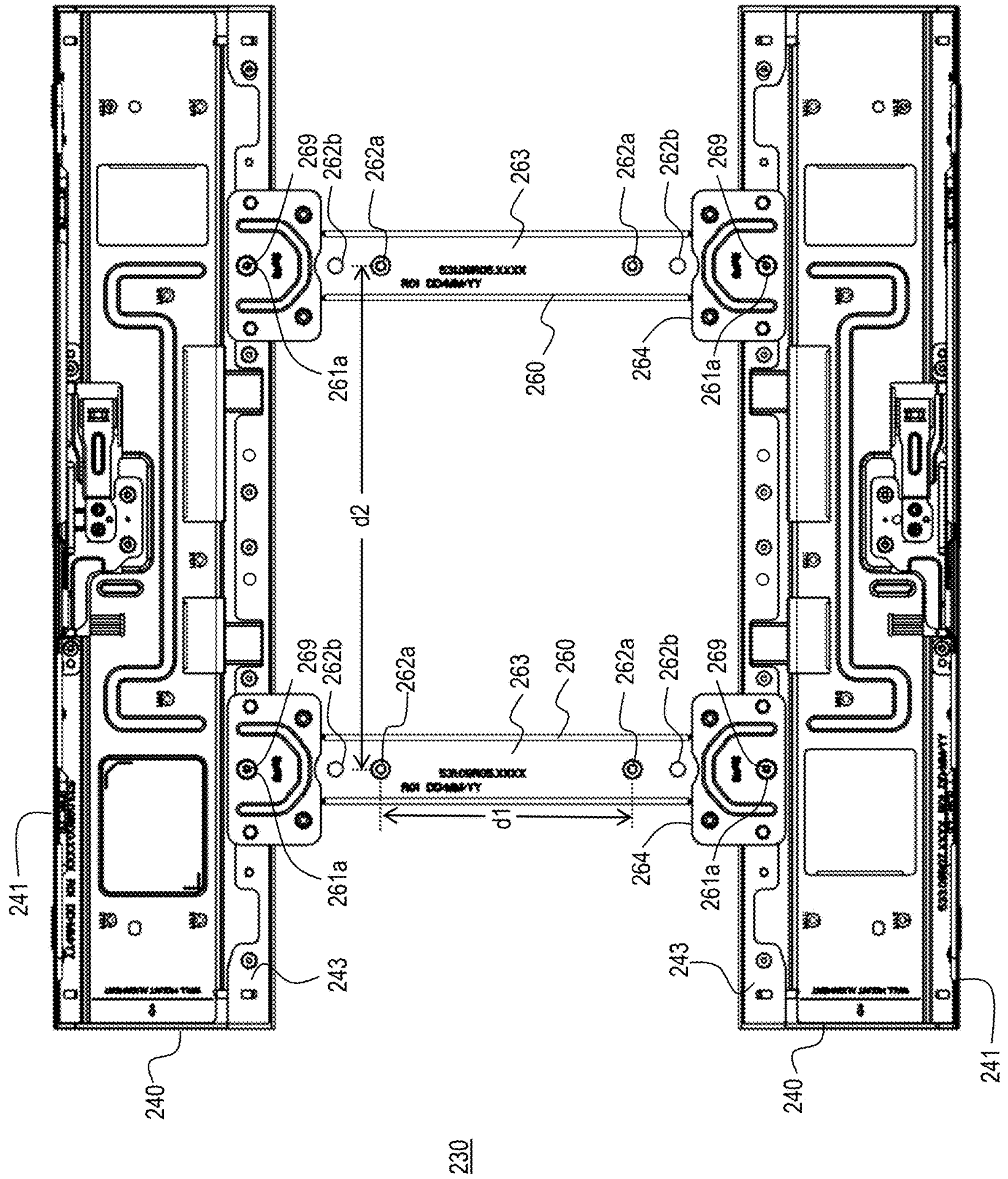
FIG. 12 is a top view of a convertible mounting assembly of the information processing system of FIG. 3 in a sixth stage of the process of converting the system from the desktop configuration to the mountable configuration.
Figure 13:
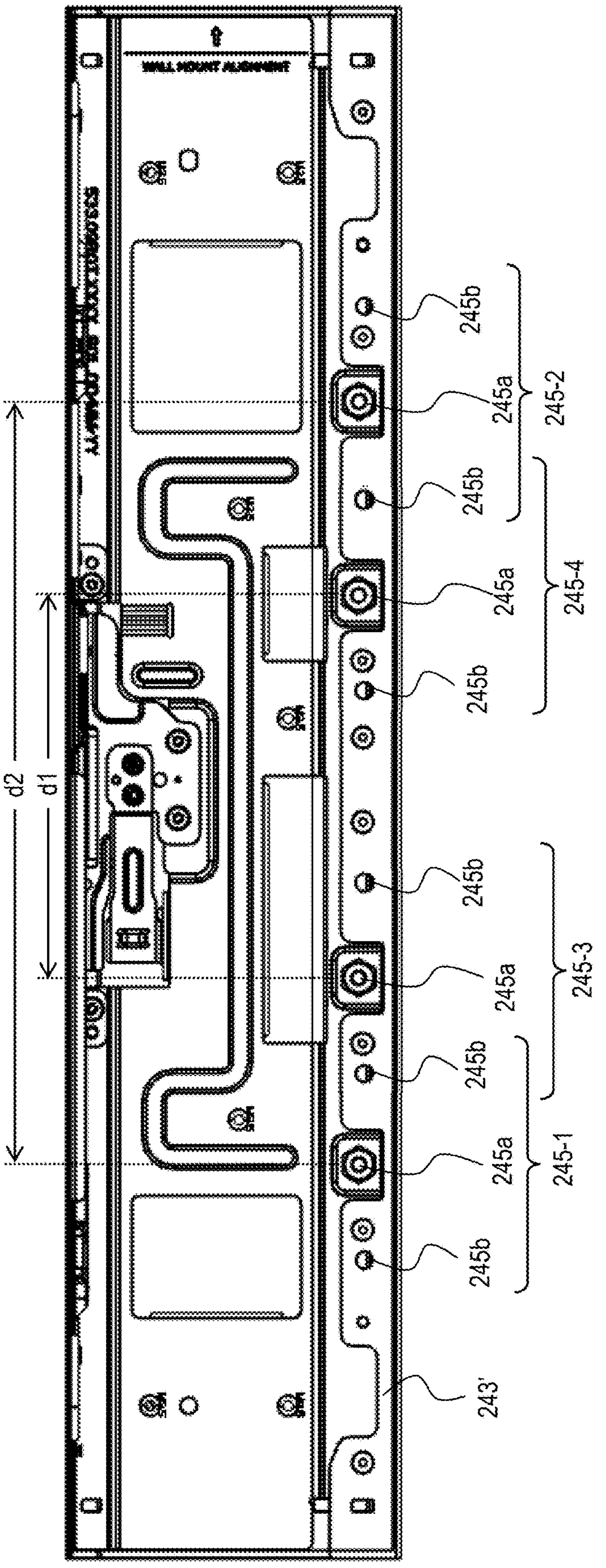
FIG. 13. is top view of an alternative side cover for the information processing system of FIG. 3.
Figure 14:
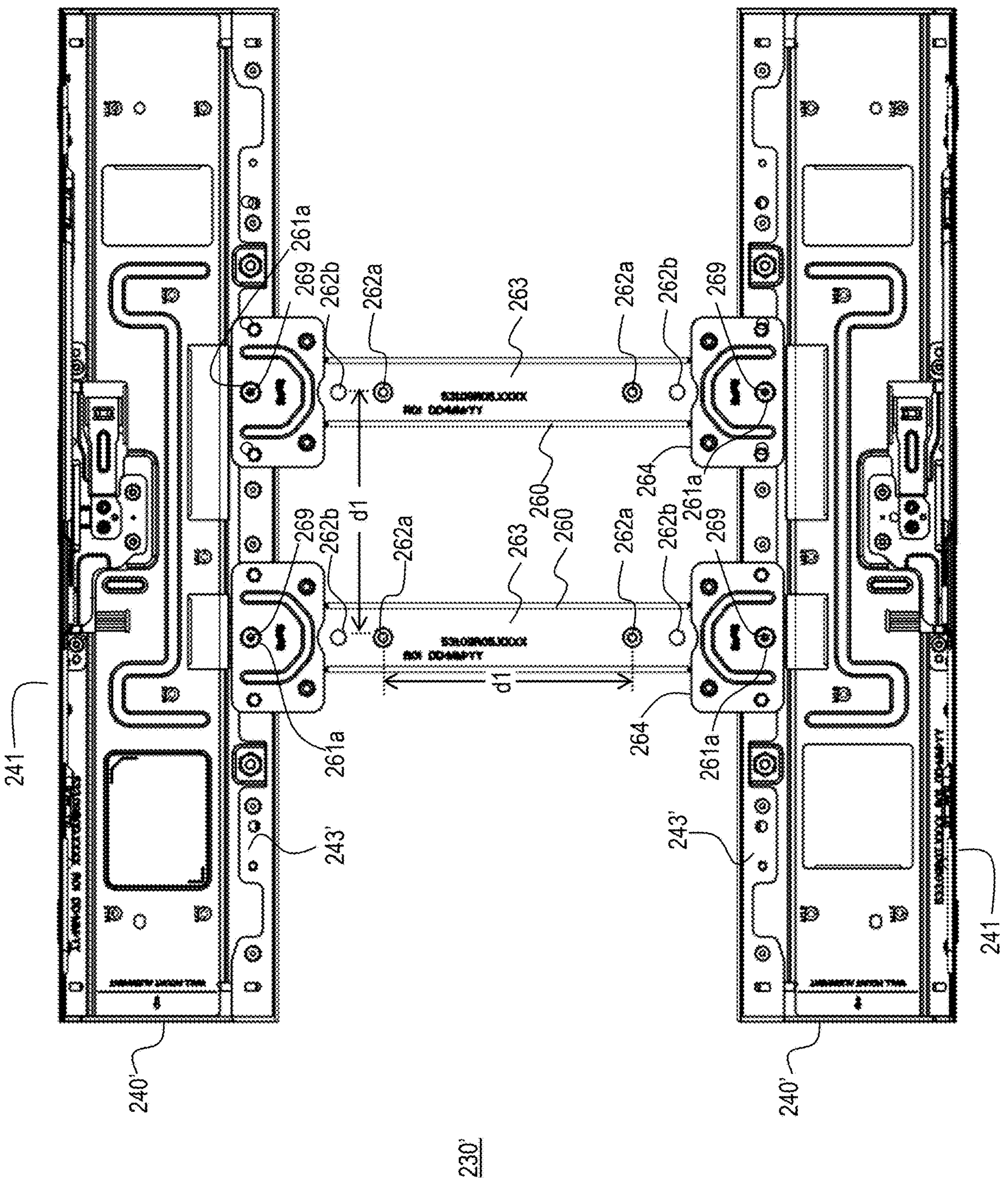
FIG. 14 is a top view of an alternative convertible mounting assembly for the information processing system of FIG. 3.
Figure 15:
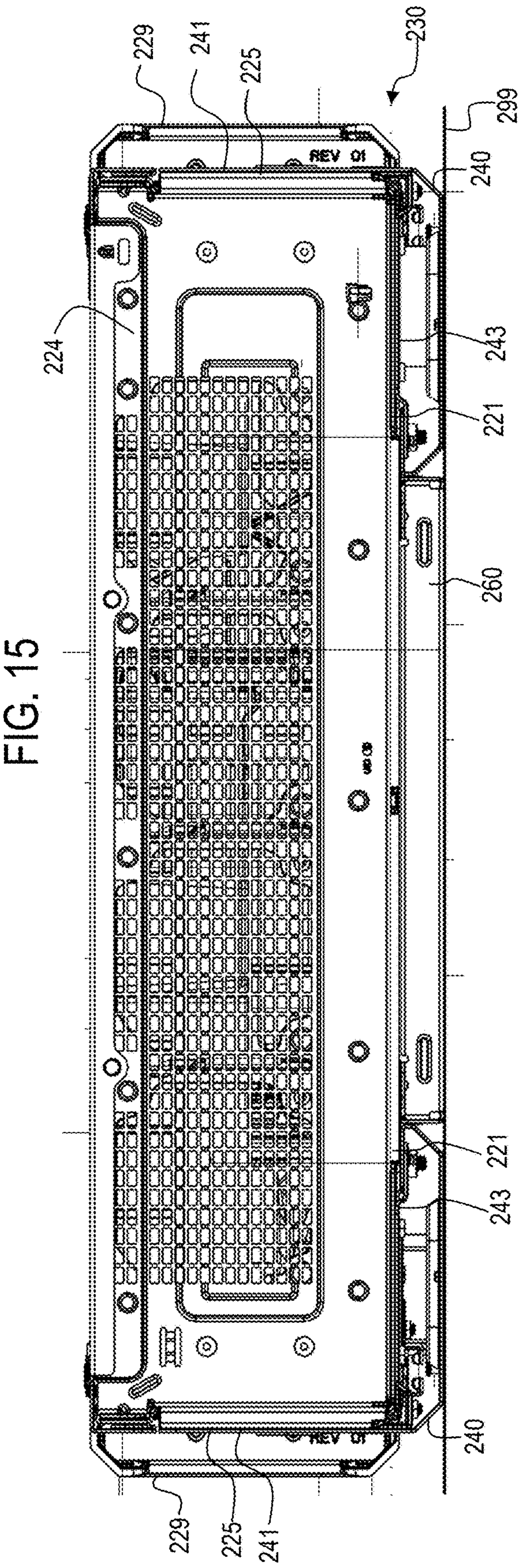
FIG. 15 is a rear view of the information processing system of FIG. 3 in the mountable configuration and mounted to a support surface.

In this example, the system 200 is an edge server, which is convertible between a desktop configuration and a mountable configuration as described above. FIG. 3 illustrates the system 200 in the desktop configuration. FIGS. 14 and 15 illustrate the system 200 in the mountable configuration in a state of the system 200 mounted to a wall. FIGS. 3-13 illustrate the system 200 in various transient states during a transition between the desktop configuration and the mountable configuration, as well as detailed views of certain components of the system 200.

As shown in FIG. 3, the system comprises a chassis 220, which is one example implementation of the chassis 220. As shown in FIG. 3, the chassis 220 comprises a base 221, a front panel 223 (see also FIG. 15), a rear panel 224, two side walls 225 (see also FIG. 4), and a top cover 222, two side covers 240. The chassis 220 also comprises a front bezel 228, which includes the front panel 223. The front bezel 228 also comprises two ears 229, which protrude laterally beyond the side walls 225, as shown in FIG. 3.

In the desktop configuration, the two side covers 240 are attached to the side walls 225. Specifically, the side covers 240 each include a first panel 241 and a second panel 243 coupled together and perpendicular to one another. In the desktop configuration, each side cover 240 wraps around one of the bottom/side edge of the chassis 120 such that the first panel 241 thereof is oriented horizontally and positioned below the base 221 while the second panel 243 thereof is oriented horizontally and positioned adjacent one of the side walls 225. In this state, the second panel 243 is attached to the side wall 225 (by bracket 250, described below).

Figure 6:
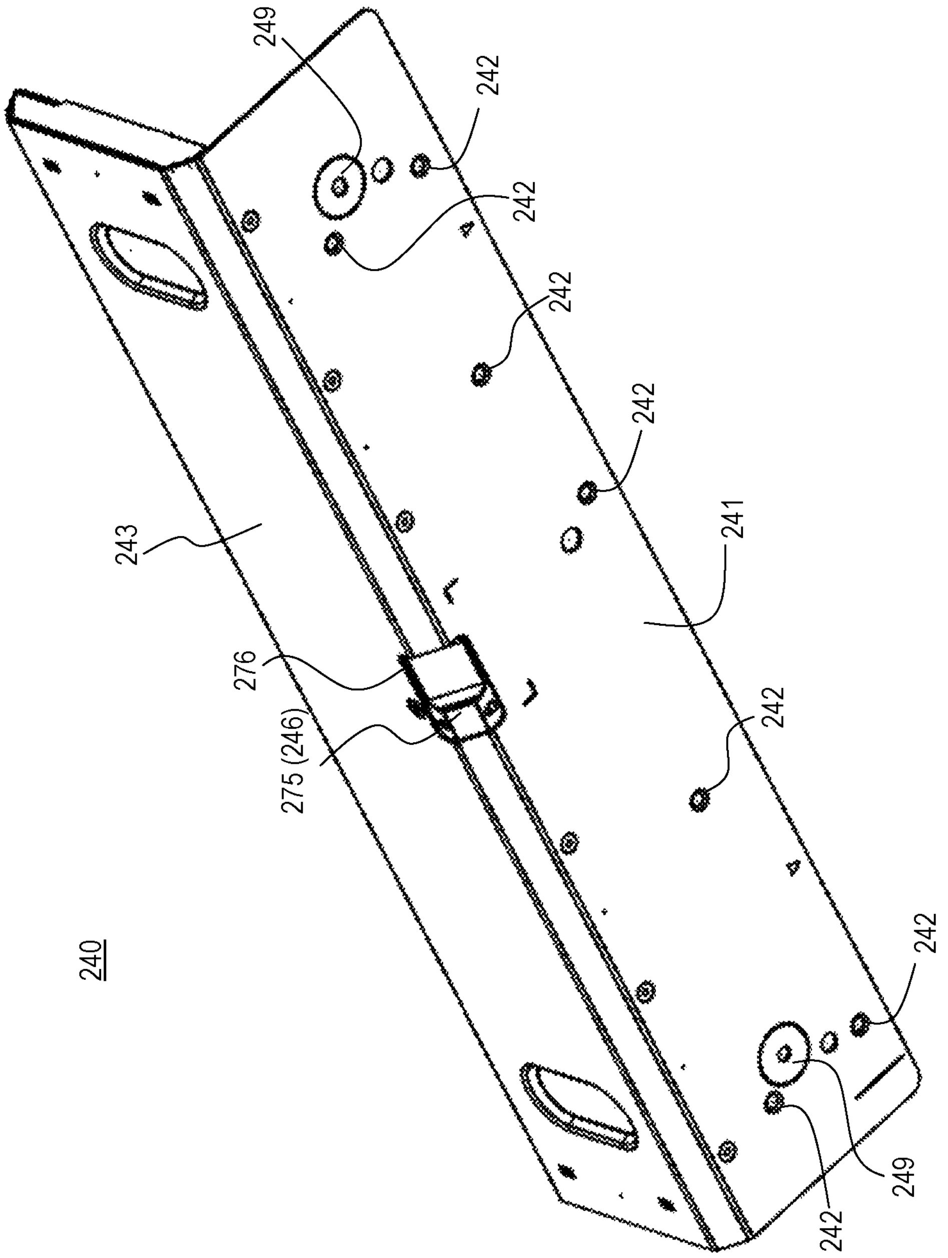
FIG. 6 is a bottom perspective view of the side cover of FIG. 5.
Figure 7:
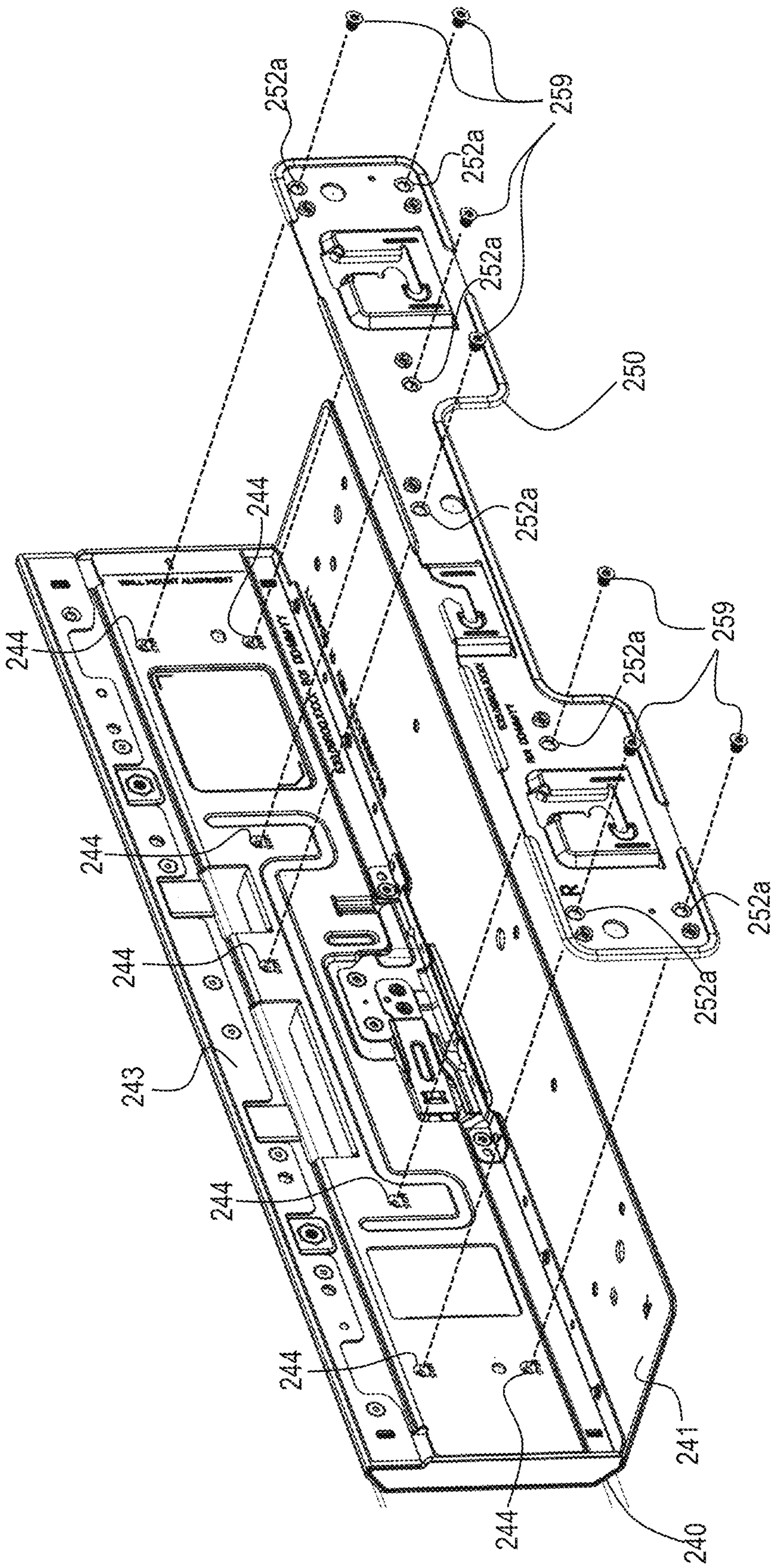
FIG. 7 is a perspective view of the side cover of FIG. 5 with a rail bracket detached from a second panel of the side cover in a second stage of the process of converting the system from the desktop configuration to the mountable configuration.

Moreover, in the desktop configuration, the second panel 243 occupies the space adjacent to and immediately rearward of the ears 229, with the outer surface of the second panel 243 being substantially flush with the outer surface of the ears. In this configuration, the second panel 243 may serve the role of covering the side walls 225 as described above. Furthermore, in this state, the first panel 241 comprises stabilizing supports 249 on a bottom side thereof, as shown in FIG. 6. These supports 249 may be, for example, compliant pads or feet, such as rubber or silicon, which are arranged to contact a horizontal support (e.g., desk) to support the system 100.

Figure 5:
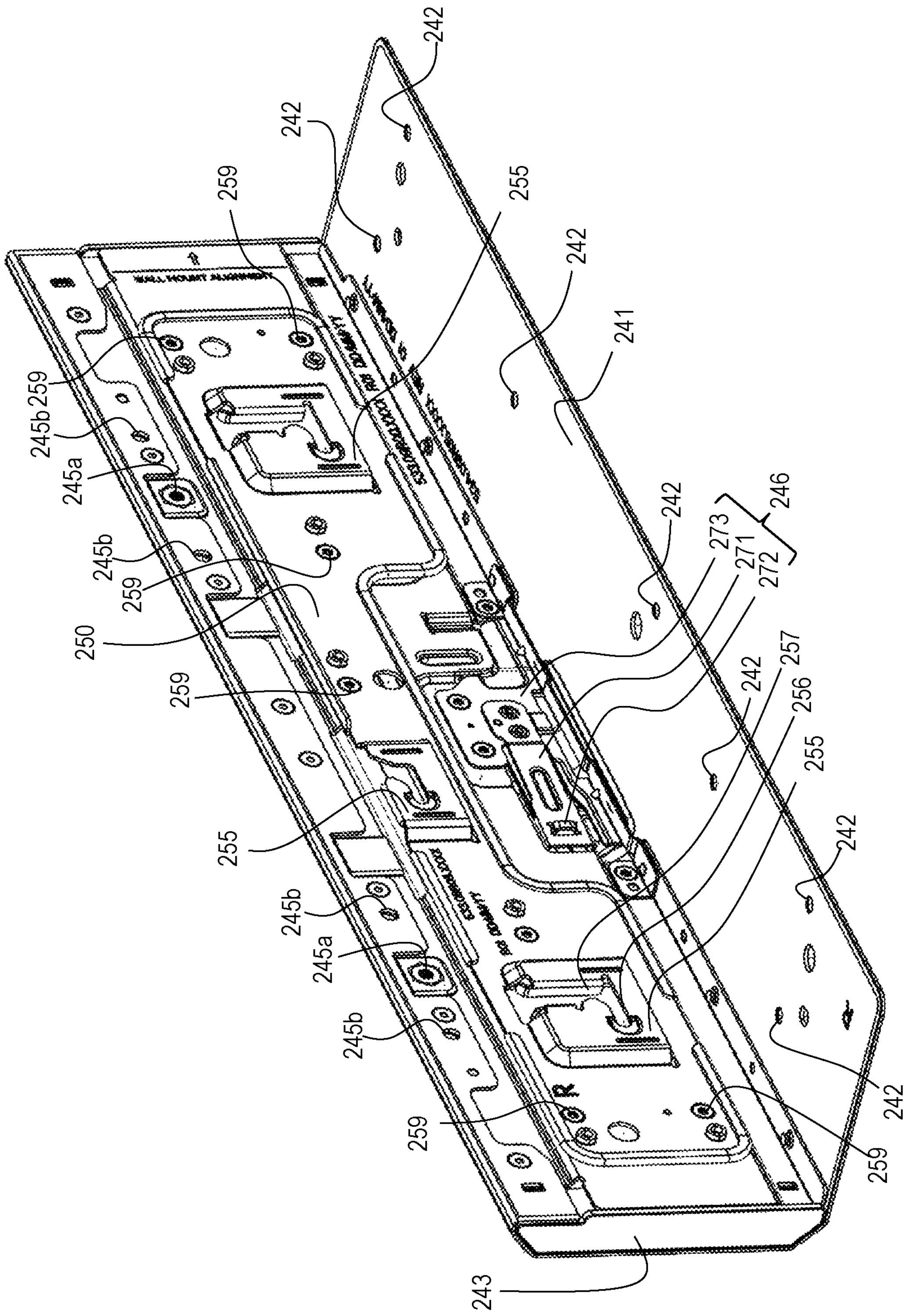
FIG. 5 is a perspective view of a side cover of the system of FIG. 3.

Furthermore, the chassis 220 comprises two rail brackets 250. In the desktop configuration, each rail bracket 250 is attached to the second panel 243 of one of the side covers 240, as shown in FIG. 5. Specifically, as show in FIG. 7, each rail bracket 250 comprises a first set of side cover attachments 252*a* and each second panel 243 comprises a number of rail bracket attachments 244, and these sets of attachments 252*a* and 244 each comprise screw holes arranged in the same pattern as one another. Screws 259 or other fasteners may extend through these attachments 252 and 244 to attach the rail bracket 250 to the second panel 243, as shown in FIG. 5. In some examples, the side cover attachments 252*a* comprise unthreaded holes through which the screws 259 extend, while the rail bracket attachments 244 comprise threaded screw holes which engage threads of the screw 259.

In the desktop configuration the brackets 250 are also attached to the side walls 225. The rail brackets 250 are attachable to the side walls 225 via engagement between spools 226 of the side walls 225 (see FIG. 4) and spool latches 255 of the brackets 250 (see FIG. 5). Specifically, to engage the spools 226 with the spool latches 255, the brackets 250 may be translated vertically relative to the side walls 225 such that each spool 226 moves down a vertical track 257 of the spool latch 255, and then the brackets may be translated horizontally relative to the side walls 225 such that the spools 226 advance along a horizontal track 256 of the corresponding spool latch 255. When the spool 226 reaches the end of the horizontal track 256, the spool is held by the spool latch 255, thus attaching the bracket 250 to the side wall 225.

Thus, the second panels 243 are attached to the side walls 225 by their attachment to the brackets 250 which are in turn attached to the side walls 225.

Figure 4:
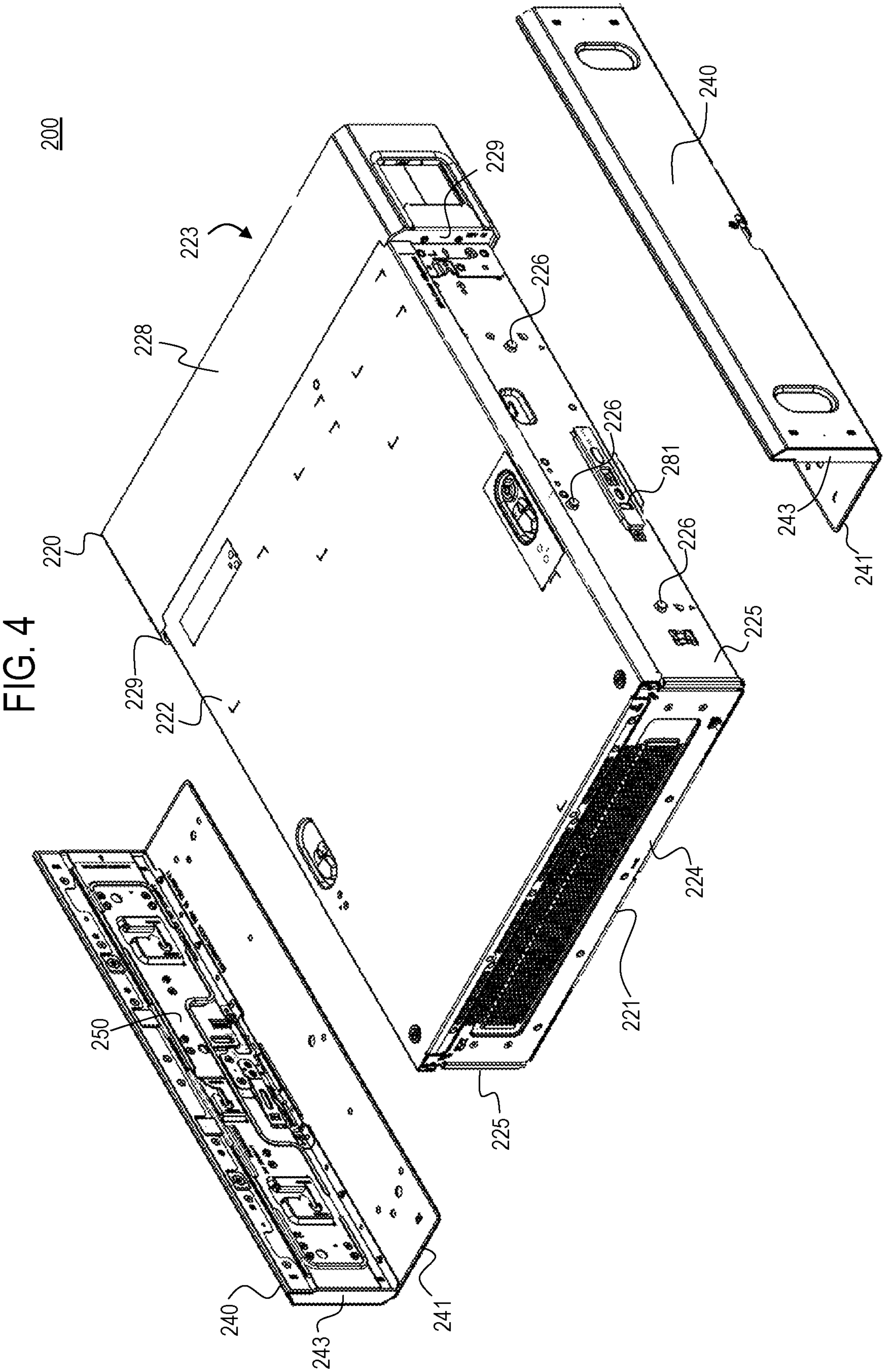
FIG. 4 is a perspective view of the system of FIG. 3 with side covers detached from side walls in a first stage of a process of converting the system from the desktop configuration to the mountable configuration.

FIG. 4 shows the system in a first stage of process of converting the chassis 220 from the desktop configuration to the mountable configuration. In this stage, the side covers 240 are removed from the rest of the chassis 220 by disengaging the rail brackets 250 from the side walls 225, as shown in FIG. 4.

In order to disengage the rail brackets 250 from the side walls 225, a lock 246 on each side cover 240 may first be moved to a disengaged position. The lock 246, when engaged, secures the side covers 240 to the side walls 225 by preventing horizontal translation of the side covers 240 relative to the side walls 225, thereby preventing detachment of the bracket 250 from the side walls 225. As described above, when the brackets 250 are attached to the side walls 225, the spools 226 are contained by the spool latches 255. To detach the brackets 250 from the side walls, the brackets 250 first need to be translated horizontally such that the spools 226 move along the horizontal track 256 and into the vertical track 257 (these tracks 256 and 257 are best seen in FIG. 5). Then the bracket 250 can be moved vertically to move the spools 226 up the vertical track 257 until ultimately freeing the spools 226 from the spool latches 255. However, if the lock 246 is engaged, it prevents the horizontal translation of the bracket 250, thereby ensuring that the spools 226 cannot move down the horizontal track 256 and therefor remain captured within the spool latches 255. Thus, prior to detaching the side covers 240, the lock may be disengaged. An example of the lock 246 will be described in greater detail below.

After removing the side covers 240 form the side walls 225, the brackets 250 may be detached from the second panels 243 by unfastening the screws 259. This results in the state shown in FIG. 7.

Figure 8:
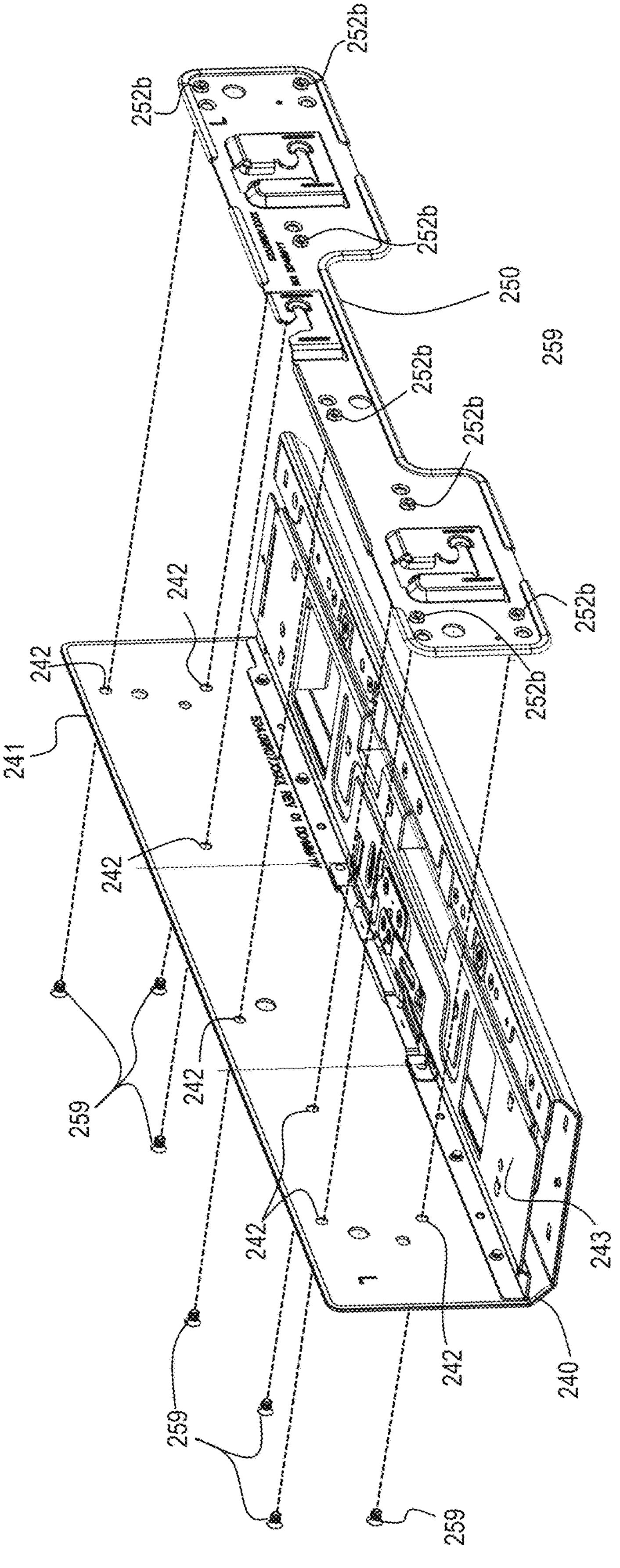
FIG. 8 is a perspective view of the side cover of FIG. 7 with the rail bracket positioned for attachment to a first panel of the side cover in a third stage of the process of converting the system from the desktop configuration to the mountable configuration.
Figure 9:
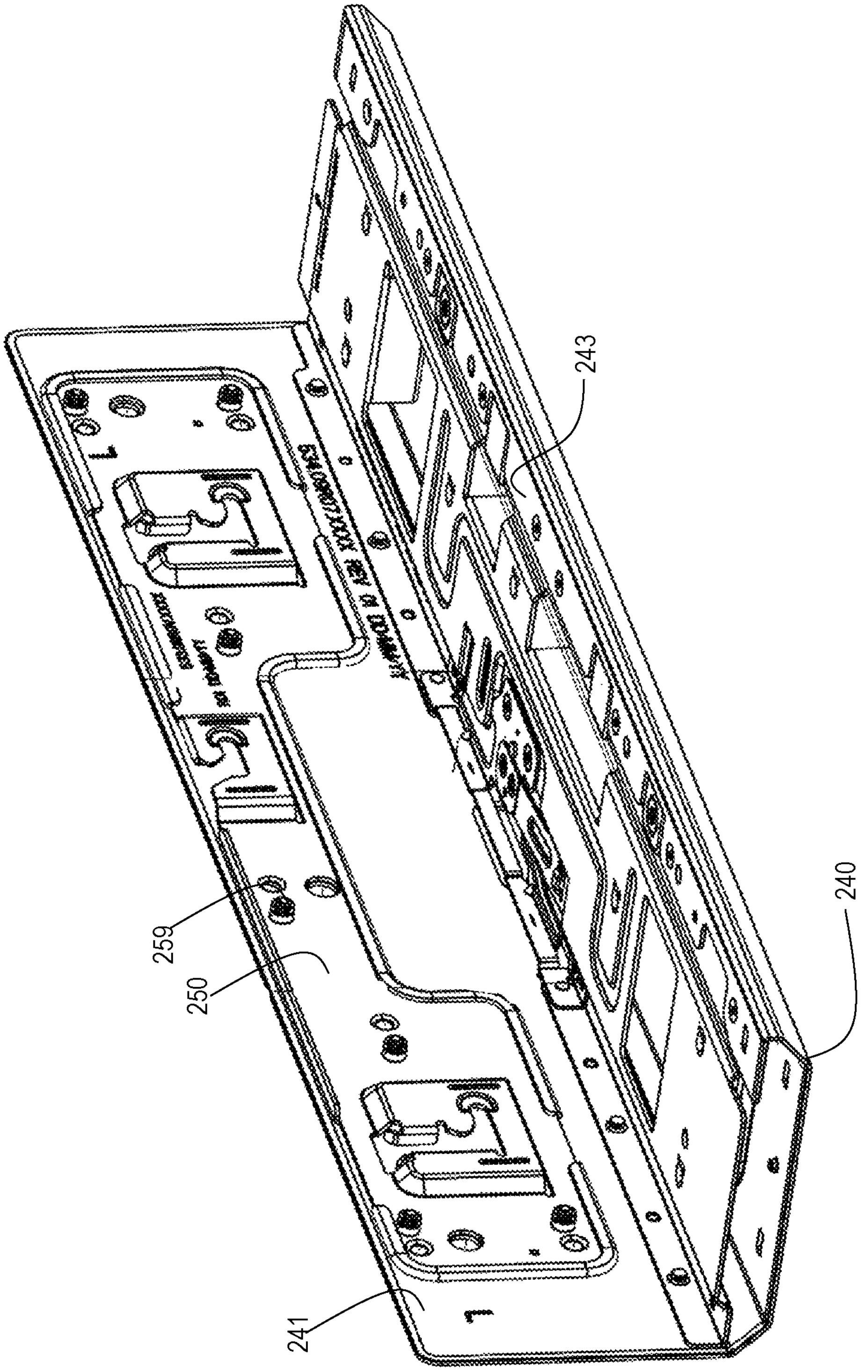
FIG. 9 is a perspective view of the side cover of FIG. 8 showing the rail bracket attached to the first panel in a fourth stage of the process of converting the system from the desktop configuration to the mountable configuration.

Next, the brackets 250 may be attached to the first panel 241 of each side cover 240. As shown in FIG. 8, the brackets 250 may comprise a second set of side cover attachments 252*b*. In this example, the second set of side cover attachments 252*b* are arranged in a similar pattern as the first set of side cover attachments 252*a*, but the second set of side cover attachments 252*b* may be configured as threaded screw holes or nuts to engage with the threads of the screw 259. The first panel 241 comprises rail bracket attachments 242 that are arranged in the same pattern as the second set of side cover attachments 252*b*, such that the screw 259 may extend through both the rail bracket attachments 242 and the side cover attachments 252*b*, as shown in FIGS. 8 and 9. In this example, the screws 259 are inserted through the brackets 250 in an opposite direction when attaching the bracket 250 to the first panel 241 as compared to when attaching the brackets to the second panel 243.

Either before or after the attachment of the brackets 250 to the first panels 241, the side covers 240 may be rotated such that the second panel 243 is now horizontal while the first panel 241 is vertical, as shown in FIG. 9. In this arrangement, the universal mounting brackets 260 may be attached to the second panels 243, forming the convertible mounting assembly 130, as shown in FIG. 12.

Figure 10:
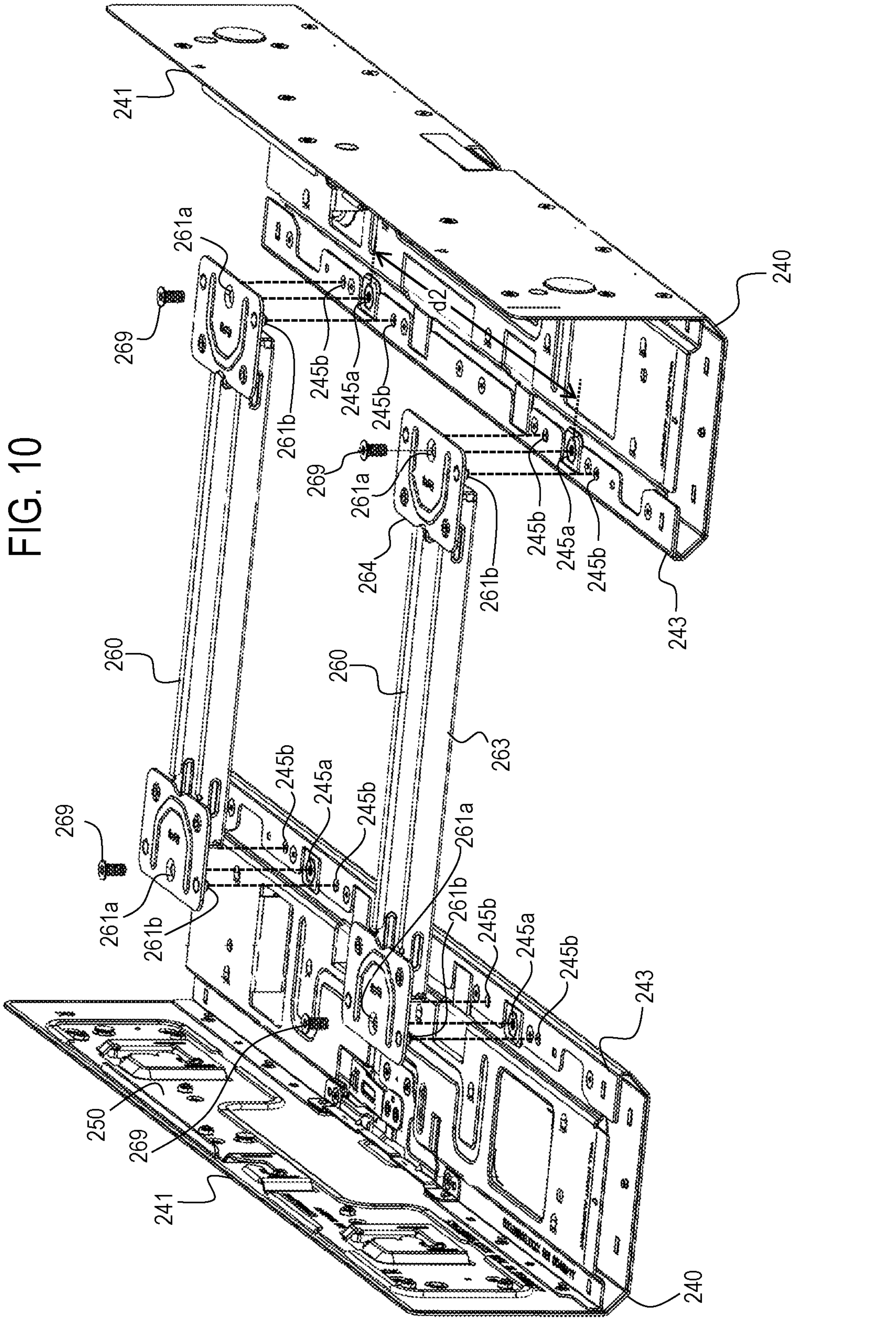
FIG. 10 is a perspective view of side covers and universal mounting brackets of the information processing system of FIG. 3 positioned for attachment to one another in a fifth stage of the process of converting the system from the desktop configuration to the mountable configuration.
Figure 11:
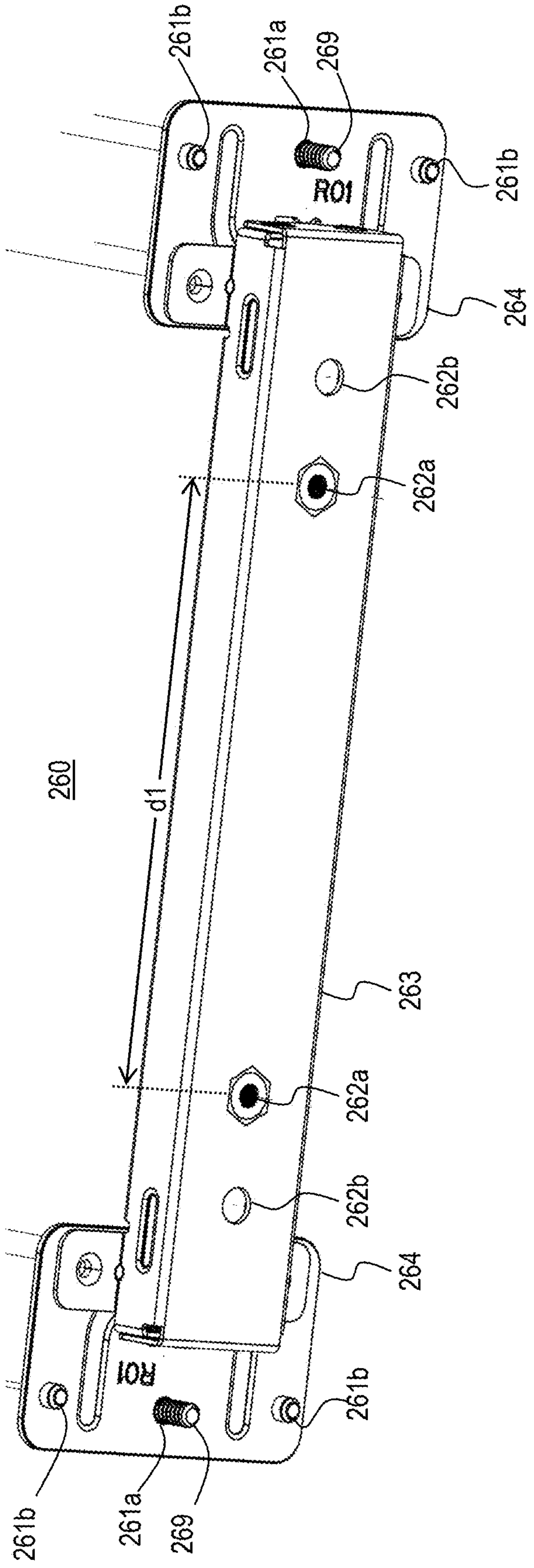
FIG. 11 is a bottom perspective view of a universal mounting bracket of FIG. 10.

As shown in FIGS. 9 and 10, each bracket 260 comprises a beam 263 with two platforms 264 at opposite ends of the beam 263. Each of the platforms 264 carries a set of side cover attachments 261, which are used to attach the bracket 260 to the second panel 243. The side cover attachments 261 include first attachments 261*a* and second attachments 261*b*. The first attachments 261*a* comprise screw holes through which a screw 269 is to be received. The second attachments 261*b* comprise studs or pegs protruding from a bottom side of the platforms 264, as best seen in FIG. 11. Each bracket 260 also comprise multiple mounting features 262 in the beam 263, which may include two VESA mounting features 262*a* and two wall mounting features 262*b*.

The two VESA mounting features 262*a* may be separated from one another along the length of the beam 263 by a predetermined distance d1 which correspond to one dimension of a VESA fastener pattern. For example, d1 may be 100 mm, in some examples. The VESA mounting features 262*a* may comprise threaded standoffs compatible with the VESA standards.

The two wall mounting features 262*b* may comprise screw holes. IN this example, the screw holes are lack threading so that a variety of screws can pass through them and pull the brackets 260 tight against a wall or other upright structure into which the screws extend. A separation distance between the mounting features 262*b* exceeds d1, in this example.

Returning to FIG. 10, each of the second panels 243 comprises a number of universal mounting bracket attachments 245 which are complementary to the side cover attachments 261. The universal mounting brackets 260 comprise first attachments 245*a* which engage with the first attachments 261*a*, and second attachments 245*b* which engage with the second attachments 261*b*. The first attachments 245*a* comprising threaded screw holes (e.g., a nuts) configured to receive the same screw 269 which has been inserted through the corresponding first attachment 261, and engage with the threads of the screw 269. The second attachments 245*b* comprise holes configured to receive the studs of the second attachments 261*b*. The engagement between the universal mounting bracket attachments 245 and the side cover attachments 261 securely attaches the brackets 260 to the second panels 243.

As shown in FIG. 10, the first and second attachments 245*a* and 245*b* are arranged in groups, with a first attachment 245*a* disposed between two second attachments 245*b*. This arrangement can help to stabilize the connection between the bracket 260 and the second panel 243 and prevent rotation of the brackets 260 about the first attachments 245*a*.

As shown in FIG. 10, two of these groups of first and second attachments 245*a* and 245*b* are arranged along the length of each second panel 243, with the first attachments 245*a* being disposed at two predetermined positions separated by the distance d2. Each of these positions corresponds to a potential mounting location for a bracket 260 to the second panel 243. When two brackets 260 are mounted to each of these two positions, the mounting assembly 230 is formed, as shown in FIG. 12. In this mounting assembly 230, because the first attachments 245*a* are separated by a distance of d2, the brackets 260 are separated from one another (center to center) by the distance d2, as shown in FIG. 12. Consequently, the VESA mounting features 262*a* of one universal mounting bracket 260 are also separated from the VESA mounting features 262*a* of the other universal mounting bracket 260 by the distance d2, as shown in FIG. 12. This distance d2 may be set to equal a second dimension of a VESA fastener pattern, such as 200 mm in some examples. Thus, by the four VESA mounting features 262*a* are located at the corners of a rectangle having dimensions of d1×d2, which in some examples may be 100 mm×200 mm, which is a VESA compatible fastener pattern. Thus, the mounting assembly 230 can be mounted to a VESA mount having this fastener pattern.

In other examples, there could be more groups of attachments 245 providing more mounting locations for the brackets 260. For example, FIG. 13 illustrates an alternative side cover 240' which has as an alternative second panel 243'. The alternative side cover 240' may be identical to the side cover 240 except that the side cover 240' includes four groups of attachments 245—groups 245-1, 245-2, 245-3, and 245-4—providing four possible mounting locations for brackets 260. The first and second groups 245-1 and 245-2 are the same as the two groups of attachments 245 found in the side cover 240 described above, and the first attachments 245*a* of these two groups are separated by d2. The third and fourth groups 245-3 and 245-4, on the other hand, are disposed closer together, with the first attachments 245*a* thereof being separated by d1. Consequently, if a pair of universal mounting brackets 260 are mounted to the first and second groups 245-1 and 245-2, the resulting mounting assembly will be essentially the same as the mounting assembly 230 of FIG. 12 (e.g., providing a 100×200 VESA mounting pattern). On the other hand, if a pair of universal mounting brackets 260 is instead mounted to the third and fourth groups 245-3 and 245-4, the alternative mounting assembly 230' illustrated in FIG. 14 results. In the alternative mounting assembly 230', the VESA mounting features 262*a* of one bracket 260 are separated from the VESA mounting features 262*a* of the other bracket 260 by d1. Thus, in this case, the four VESA mounting features 262*a* are located at the corners of a square having dimensions of d1×d1, which in some examples may be 100 mm×100 mm, which is another VESA compatible fastener pattern. Thus, the alternative mounting assembly 230' can be mounted to a VESA mount having this fastener pattern.

The mounting assembly 230 (or the alternate mounting assembly 230') may be mounted to support structure such as a vertical flat surface (e.g., wall, a post, etc.), a VESA mount, or DIN mount. If a vertical flat surface is selected as the support structure, screws may be driven through the wall mounting features 262*b* and into the support surface. If a VESA mount is selected as the support structure, VESA compatible screws may be driven through the VESA mounting features 262*a* and through complementary mounting features on the VESA mount, which may share a same two dimensional pattern as the VESA mounting features. If a DIN mount is selected, a DIN clip may be attached to each of the brackets 260 by, for each bracket 260, driving a screw through one or both of the wall mounting features 262*b* or through one or both of the VESA mounting features 262*a* thereof, and then the DIN clips may be removably attached to a DIN rail. Mounting to other types of support structures may also be possible, assuming that they will accept fasteners (e.g., screws) with the two dimensional arrangements provided by the brackets 260.

Once the mounting assembly 230 (or 230') is mounted to the support structure, the remainder of the system 200 can be mounted to the mounting assembly 230. In some examples, the mounting assembly 230 (or 230') may be mounted to the support structure such that the first panels 241 thereof extend horizontally, parallel to the ground. The remainder of the system 200 may thus be mounted to the mounting assembly 230 by positioning the remainder of the chassis 220 between the two first panels 241 such that the side walls 225 face and abut the first panels 241, aligning the spools 226 of the side walls 225 with the spool latches 255, pushing the chassis 220 towards the support structure such that the spools enter and travel down the length of the vertical tracks 257 of the spool latches 255, and then sliding the chassis 220 parallel to the support structure such hat the spools 226 travel along the horizontal tracks 256 of the spool latches 255. When the spools 226 reach the ends of the horizontal tracks 256, they are retained by the spool latches 255 and the remainder of the chassis 220 is now secured to the mounting assembly 130, and hence also to the support structure. The lock 246 may engage at this point to hold the system in this state until actuated to disengage the system.

Figure 16:
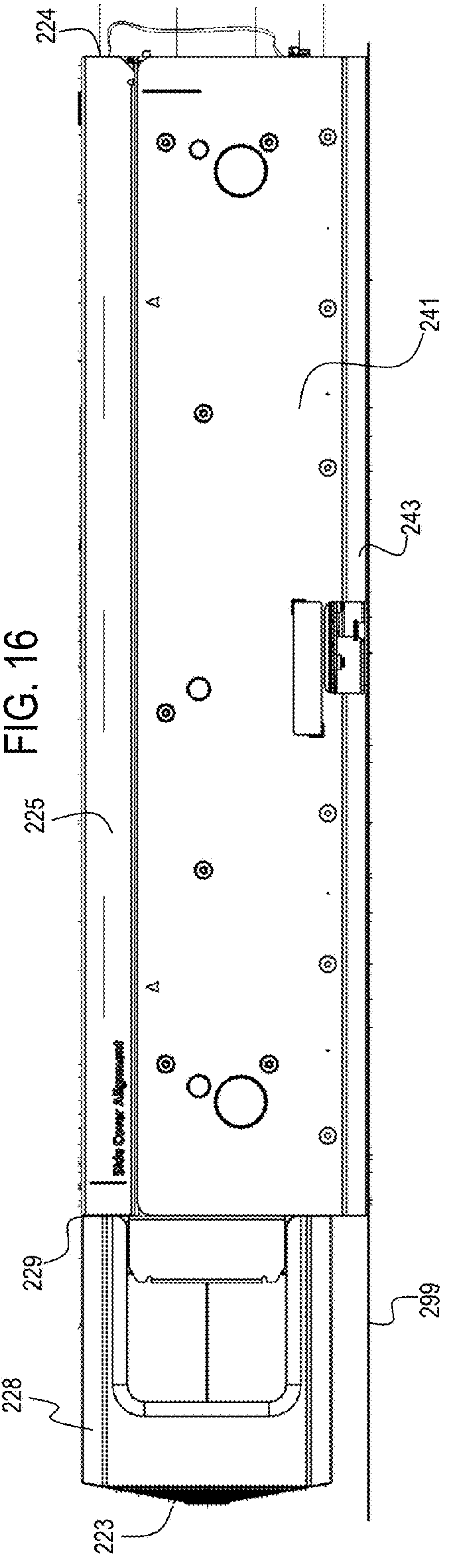
FIG. 16 is a side view of the information processing system of FIG. 3 in the mountable configuration and mounted to the support surface.

FIG. 15 illustrates the system 200 from a rear view mounted to a support structure 299. FIG. 16 illustrates the system 200 from a side view mounted to the support structure 299. As can be seen, in the mounted state, the second panels 243 abut the support structure and the base 221, while the first panels 241 abut the side walls 225.

Figure 17:
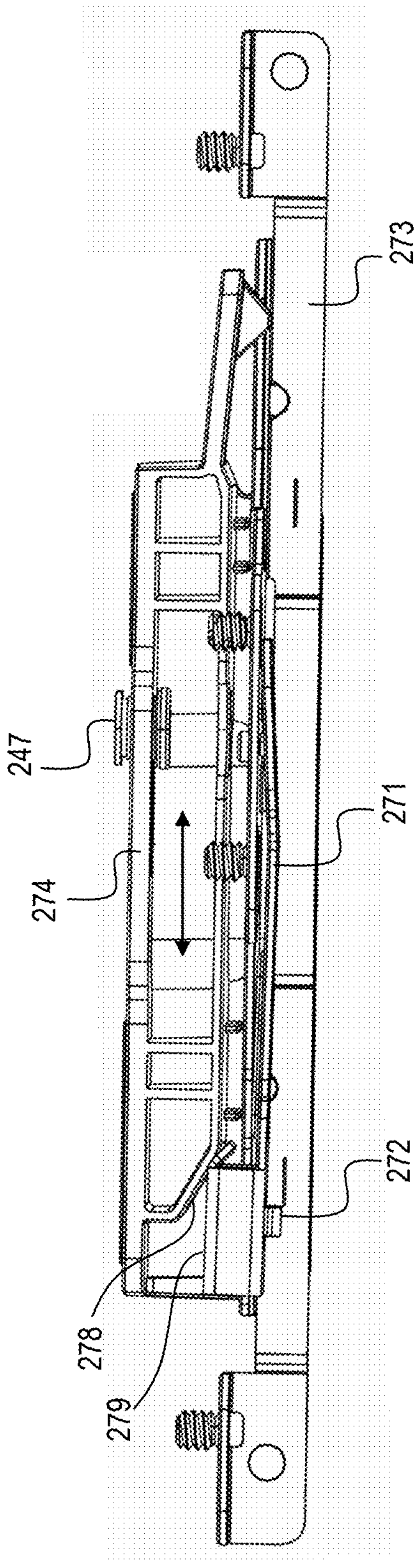
FIG. 17 is a top view of a lock of the information processing system of FIG. 3 in a locked position.
Figure 18:
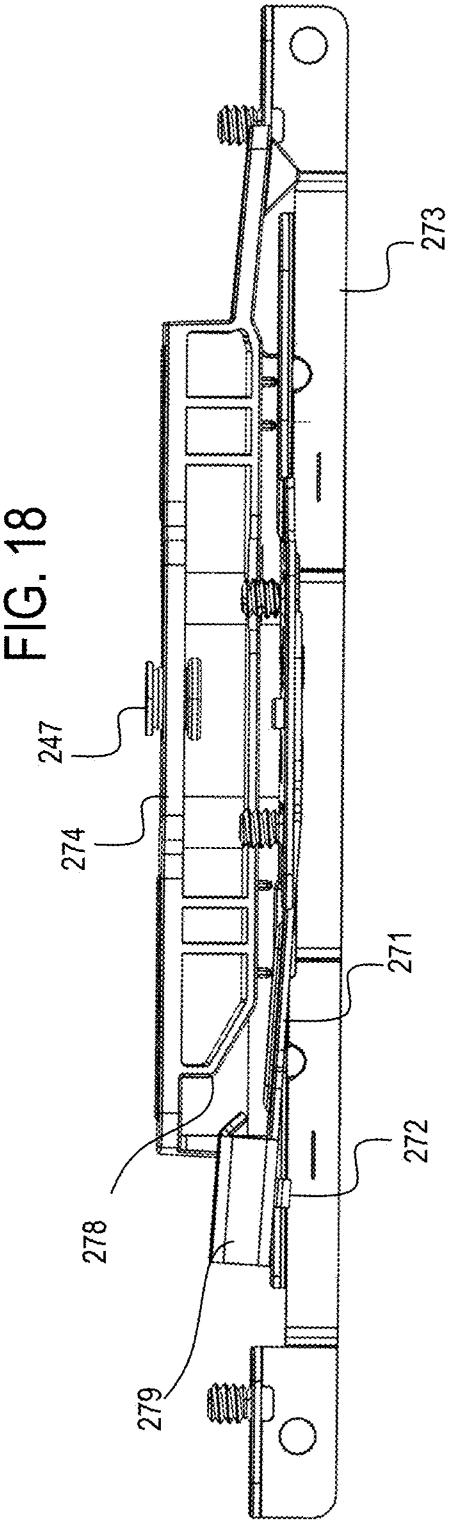
FIG. 18 is a top view of a lock of the information processing system of FIG. 3 in an unlocked position.

Turning to FIGS. 17 and 18, the lock 246 will be described in more detail. Portions of the lock 246 are also visible in FIGS. 5 and 6. FIGS. 17 and 18 show a top view of the lock 246 with other parts of the side cover 240 omitted. The lock 246 comprises a bracket 273 which attaches the lock 246 to the second panel 243. The lock 246 also comprise a latch arm 271 which is attached to the bracket 273. The lock 246 also comprises a sliding actuator 274. The sliding actuator 274 is movable coupled to the second panel 243 by a guide pin 247, which is attached to the second panel 243. The sliding actuator 274 can be manually moved along the directions indicated by the arrows in FIG. 17. A user may move the actuator 272 by manually pushing/pulling on button 275, which is part of, or attached to, the actuator 274. As shown in FIG. 6, the button 275 is accessible on the bottom edge of the side cover 240 inside an aperture 276. Returning to FIGS. 17 and 18, the sliding actuator 274 comprises a sloped ramp 278 at one end thereof, and this sloped ramp 278 is arranged to engage with an end portion 279 of the latch arm 271.

When the actuator 274 is in a locked position, which corresponds to the position shown in FIG. 17 (the leftmost position in the figure), the sloped ramp 278 pushes against the end portion 279, which deflects the end portion 279 outward (downward in the figure). The results in a tab 272 carried by the end portion 279 being positioned downward, as shown in FIG. 17. In this position, the tab 272 can engage with a corresponding slot in the chassis 220 to prevent movement. In the desktop configuration, the corresponding part is a slot 281 in the side wall 225, as visible in FIG. 4. In the mountable configuration, the corresponding slot is a slot formed in the base 221, which is not visible in the figures. In both cases, the engagement between slot and tab 272 prevents motion of the tab 272 along the directions of the arrows in FIG. 17. Because the tab 272 is rigidly connected to the latch arm 271, which is in turn connected to the bracket 273, which is in turn connected to the second panel 243, the engagement between the slot and tab 272 prevents sliding motion of the second panel 243 relative to the side wall 225. This can prevent the spools 226 from disengaging from the spool latches 255.

When the actuator 274 is moved to the unlocked position, which corresponds to the position shown in FIG. 18 (the rightmost position in the figure), the sloped ramp 278 no longer engages the end portion 279, and the spring forces of the latch arm 271 cause it to return to its resting position in which the end portion 279 is moved away from the side wall 225 (upward in the figure). The results in a tab 272 carried by the end portion 279 being positioned upward, as shown in FIG. 18, and disconnecting from the corresponding slot. With the tab 272 disengaged from the slot, the second panel 243 is free to slide relative to the side wall 225.

It is to be understood that both the general description and the detailed description provide examples that are explanatory in nature and are intended to provide an understanding of the present disclosure without limiting the scope of the present disclosure. Various mechanical, compositional, structural, electronic, and operational changes may be made without departing from the scope of this description and the claims. In some instances, well-known circuits, structures, and techniques have not been shown or described in detail in order not to obscure the examples. Like numbers in two or more figures represent the same or similar elements.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as coupled may be electronically or mechanically directly coupled, or they may be indirectly coupled via one or more intermediate components, unless specifically noted otherwise. Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Elements and their associated aspects that are described in detail with reference to one example may, whenever practical, be included in other examples in which they are not specifically shown or described. For example, if an element is described in detail with reference to one example and is not described with reference to a second example, the element may nevertheless be claimed as included in the second example.

Unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

Further modifications and alternative examples will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various examples shown and described herein are to be taken as exemplary. Elements and materials, and arrangements of those elements and materials, may be substituted for those illustrated and described herein, parts and processes may be reversed, and certain features of the present teachings may be utilized independently, all as would be apparent to one skilled in the art after having the benefit of the description herein. Changes may be made in the elements described herein without departing from the scope of the present teachings and following claims.

It is to be understood that the particular examples set forth herein are non-limiting, and modifications to structure, dimensions, materials, and methodologies may be made without departing from the scope of the present teachings.

Other examples in accordance with the present disclosure will be apparent to those skilled in the art from consideration of the specification and practice of the invention disclosed herein. It is intended that the specification and examples be considered as exemplary only, with the following claims being entitled to their fullest breadth, including equivalents, under the applicable law.

What is claimed is:

1. An information processing system, comprising:

a chassis; and a system board supported by the chassis;

wherein the chassis comprises two side walls and two side covers attached to the side walls, the side covers each comprising a first panel and a second panel connected together and perpendicular to one another, wherein the chassis is reconfigurable between a desktop configuration and a mountable configuration, wherein in the desktop configuration, the side covers are attached to the side walls by the second panels of the side covers, wherein in the mountable configuration, each of the side covers are is attached to a different one of the side walls by a respective first panel of the side cover, and wherein the chassis further comprises two rail brackets, each rail bracket configured to:

attach the second panel of one of the side covers to one of the side walls in the desktop configuration, and attach the first panel of one of the side covers to one of the side walls in the mountable configuration.

2. The information processing system of claim 1, wherein each of the rail brackets comprises a set of side cover attachments, wherein the second panel of each side cover comprises a set of rail bracket attachments complementary to the side cover attachments and configured to engage with the side cover attachments of one of the rail brackets to attach the rail bracket to the second panel in the desktop configuration, and wherein the first panel of each side cover comprises another set of rail bracket attachments complementary to the side cover attachments and configured to engage therewith to attach the rail bracket to the first panel in the mountable configuration.

3. The information processing system of claim 2, wherein each of the rail brackets comprises a set of spool latches, wherein each of the side walls comprises a set of spools configured to engage with the spool latches of one of the rail brackets to attach the rail bracket to the side wall.

4. The information processing system of claim 3, wherein at least some of the spool latches comprise a horizontal track coupled to a vertical track such that a spool is engaged with the spool latch by moving the bracket along a height dimension of the side wall to move the spool along the vertical track followed by moving the bracket along a longitudinal dimension of the side wall to move the spool along the horizontal track.

5. The information processing system of claim 1, further comprising:

at least one universal mounting bracket configured to be, in the mountable configuration, attached to the second panel of each of the side covers such that the side covers and the universal mounting bracket form a convertible mounting assembly, wherein the universal mounting brackets comprise at least two different sets of mounting features for mounting the convertible mounting assembly to at least two different forms of support structure.

6. The information processing system of claim 5, wherein the at least one universal mounting bracket comprises two universal mounting brackets.

7. The information processing system of claim 6, wherein each of the universal mounting brackets comprises two video electronics standards association (VESA) mounting features spaced apart from one another along the bracket by a distance equal to a first dimension of at least one VESA fastener pattern.

8. The information processing system of claim 7, wherein the second panels of the side covers comprise universal mounting bracket attachments configured to engage with complementary side cover attachments of the universal mounting brackets to attach the universal mounting brackets to the second panels.

9. The information processing system of claim 8, wherein the universal mounting bracket attachments are positioned such that the universal mounting brackets are attachable to the second panels of the side covers with a spacing between the universal mounting brackets being equal to a second dimension of the VESA fastener pattern.

10. The information processing system of claim 9, wherein first dimension is 100 mm and the second dimension is 200 mm.

11. The information processing system of claim 8, wherein the universal mounting bracket attachments are positioned such that the universal mounting brackets are attachable to the second panels of the side covers in two different arrangements having two different spacings between the universal mounting brackets, including a first spacing equal to a second dimension of a first VESA fastener pattern and a second spacing equal to a second dimension of a second VESA fastener pattern.

12. The information processing system of claim 11, wherein first dimension is 100 mm, the second dimension of the first VESA fastener pattern is 200 mm, and the second dimension of the second VESA fastener pattern is 100 mm.

13. The information processing system of claim 7, wherein each of the universal mounting brackets comprises two wall mounting features configured to receive screws to mount the convertible mounting assembly to a wall.

14. The information processing system of claim 1, wherein the first panel and the second panel are connected together at their respective ends; and wherein, in the desktop configuration, the second panel of each of the side covers covers one of the side walls and the first panel of each of the side covers is disposed below a base of the chassis.

15. The information processing system of claim 1, wherein the first panel of each of the side covers comprises stabilizing supports arranged to support the system on a horizontal surface.

16. A method comprising:

converting a chassis of an information processing system from a desktop configuration to a mountable configuration by:

removing side covers from side walls of the chassis, the side covers each comprising a first panel and a second panel connected together and perpendicular to one another, wherein in the desktop configuration the second panels of the side covers are adjacent to the side walls, respectively, and the second panels of the side covers attach the side covers to the side walls, respectively;

detaching rail brackets from the second panels of the side covers, respectively, wherein in the desktop configuration the second panel of each side cover is connected to one of the side walls by one of the rail brackets;

attaching the rail brackets to the first panels of the side covers, wherein in the mountable configuration the first panel of each side cover is connectable to one of the side walls by the rail brackets;

reorienting the side covers such that the first panels of the side covers are adjacent to the side walls, respectively; and reattaching the side covers to the side walls by attaching a respective first panel of each side cover to a different one of the side walls.

17. The method of claim 16, comprising, after attaching the rail brackets to the first panels and before reattaching the side covers to the side walls:

forming a convertible mounting assembly by attaching universal mounting brackets to the second panels of the side walls, the universal mounting brackets comprising at least two different sets of mounting features for mounting the convertible mounting assembly to at least two different forms of support structure; and mounting the convertible mounting assembly to a support structure using one of the sets of mounting features.

18. The method of claim 17, wherein reattaching the side covers to the side walls by attaching the first panels of the side covers to the side walls, respectively, comprises:

positioning a remainder of the chassis between the first panels of the side walls of the convertible mounting assembly mounted to the support structure, and sliding the remainder of the chassis relative to the convertible mounting assembly to engage spools of the side walls with spool latches of the rail brackets.

19. The method of claim 16, wherein the first panel and the second panel are connected together at their respective ends; and wherein, in the desktop configuration, the second panel of each of the side covers covers one of the side walls and the first panel of each of the side covers is disposed below a base of the chassis.

20. The method of claim 16, wherein the first panel of each of the side covers comprises stabilizing supports arranged to support the system on a horizontal surface.

* * * * *